(12) United States Patent
Yong

(10) Patent No.: US 10,584,242 B2
(45) Date of Patent: Mar. 10, 2020

(54) NATURAL RUBBER BASED ELECTRICALLY CONDUCTIVE THERMOPLASTIC VULCANISATES AND THE DEVICE FOR MANUFACTURING THE SAME

(71) Applicant: LEMBAGA GETAH MALAYSIA, Kuala Lumpur (MY)

(72) Inventor: Kok Chong Yong, Kuala Lumpur (MY)

(73) Assignee: LEMBAGA GETAH MALAYSIA, Kuala Lumper (MY)

( * ) Notice: Subject to any disclaimer, the term of this patent is extended or adjusted under 35 U.S.C. 154(b) by 23 days.

(21) Appl. No.: 15/777,056

(22) PCT Filed: Oct. 18, 2016

(86) PCT No.: PCT/MY2016/000066
§ 371 (c)(1),
(2) Date: May 17, 2018

(87) PCT Pub. No.: WO2017/086773
PCT Pub. Date: May 26, 2017

(65) Prior Publication Data
US 2018/0346719 A1 Dec. 6, 2018

(30) Foreign Application Priority Data
Nov. 17, 2015 (MY) .......................... PI 2015002764

(51) Int. Cl.
*C08L 79/02* (2006.01)
*C08L 7/00* (2006.01)
*C08J 3/20* (2006.01)
*H05K 9/00* (2006.01)

(52) U.S. Cl.
CPC .............. *C08L 79/02* (2013.01); *C08J 3/203* (2013.01); *C08L 7/00* (2013.01); *H05K 9/0081* (2013.01); *C08J 2307/00* (2013.01); *C08J 2379/02* (2013.01); *C08J 2407/00* (2013.01); *C08J 2423/12* (2013.01); *C08J 2479/02* (2013.01); *C08L 2203/20* (2013.01); *C08L 2205/03* (2013.01); *C08L 2205/08* (2013.01)

(58) Field of Classification Search
CPC .. C08L 79/02; C08L 23/12; C08L 7/00; C08L 2203/20; C08L 2205/03; C08L 2205/08; H05K 9/0081; C08G 73/0266; C08J 2379/02; C08J 2423/12; C08J 2323/12; C08J 2307/00; C08J 2300/208; C08J 2407/00; C08J 3/203; C08J 3/2056; C08J 3/20; C08J 2479/02

USPC ......................................................... 252/500
See application file for complete search history.

(56) References Cited

U.S. PATENT DOCUMENTS

| | | | |
|---|---|---|---|
| 6,519,137 B1 * | 2/2003 | Nitta ........................ | H01G 9/15 361/525 |
| 6,624,251 B1 | 9/2003 | Chmielewski | |
| 6,908,221 B2 | 6/2005 | Proni et al. | |
| 7,462,309 B2 | 12/2008 | Miller et al. | |
| 7,645,399 B2 * | 1/2010 | Tarnawskyj ....... | G03G 15/0233 252/510 |
| 2006/0004126 A1 | 1/2006 | Park et al. | |
| 2010/0320427 A1 * | 12/2010 | Yong ........................ | C09K 3/16 252/519.33 |

FOREIGN PATENT DOCUMENTS

| WO | WO-2012169874 A1 * | 12/2012 | ............... C08K 3/04 |
|---|---|---|---|
| WO | WO-2014123405 A1 * | 8/2014 | ............... C08L 9/02 |

OTHER PUBLICATIONS

K.C. Yong, "Preparation and Characterisation of Electrically Conductive Thermoplastic Vulcanisate Based on Natural Rubber and Polypropylene Blends of Polyaniline", Polymers & Polymer Composites, 24(3), 225-232 (2016). (Year: 2016).*
Mondal et al., "Polypropylene/natural rubber thermoplastic vulcanizates by eco-friendly and sustainable electron induced reactive processing." Radiation Physics and Chemistry, Jul. 2013, vol. 88, pp. 74-81.
Young, K.C. "Novel peroxide vulcanized NBR PAni. DBSA blends, part 2: Effects of conductive filler particles alignment." Journal of Applied Polymer Science, Apr. 2012, vol. 124, pp. 729-739.
De Souza Jr., F. G. et al., "Preparation of a semi-conductive thermoplastic elastomer vulcanizate based on EVA and NBR blends with polyaniline." Polymer Testing, 2007, vol. 26, pp. 692-697.

* cited by examiner

*Primary Examiner* — Douglas J McGinty
(74) *Attorney, Agent, or Firm* — Maschoff Brennan

(57) ABSTRACT

The various embodiments of the present invention disclose an peroxide-vulcanised TPVs based on Hevea *Brasiliensis* natural rubber, polypropylene and solid sulfonic acid doped polyaniline [PAni.DBSA] with useful electrical conductivities (up to about 2.1±0.2 S/cm] can be produced by using an internal mixer. The peroxide-vulcanised TPVs exhibit useful physical properties and also possess a reasonable good electromagnetic interferences shielding effectiveness. These peroxide-vulcanised TPVs could be recycled up to 4 times without significant loss of their EMI SE, electrical and physical properties. As a result, they have good potential to be used for manufacturing any EMI shielding products, such as EMI shielding seals and gaskets.

6 Claims, 4 Drawing Sheets

With x > 1.0; y < 1.0

NATURAL RUBBER BASED ELECTRICALLY CONDUCTIVE THERMOPLASTIC VULCANISATES AND THE DEVICE FOR MANUFACTURING THE SAME

FIELD OF INVENTION

This present disclosure generally relates to natural rubber based electrically conductive thermoplastic vulcanisates and the processes for manufacturing such materials. The present invention more particularly relates to a process and device for manufacturing Hevea *Brasiliensis* natural rubber based electrically conductive thermoplastic vulcanisates, prepared through a process of practical and environmentally friendly methodology such as high temperature-mechanical mixing.

BACKGROUND OF INVENTION

Thermoplastic vulcanisates [TPVs] are general blends of rubber and thermoplastic. These TPVs possess properties that are as good as or maybe better than those of elastomeric block copolymers. TPVs are usually multi-phase polymer systems consisting of hard and soft domains which can either be copolymers or mechanical blends. In these TPVs, the role of elastomer is to improve the impact strength and ductility of the plastic. The stiffness of the elastomer is also increased with the incorporation of plastic into the elastomer matrix.

TPVs comprises of vulcanising rubber which during the melting process mixes well with the molten plastic and is produced by using a dynamic vulcanisation technique. TPVs behave just like conventional elastomeric materials at ambient temperature. However, they can be readily processed just like thermoplastics while being applied with the heat. TPVs possess a good commercial application potential since they do not have to be vulcanised during fabrication into final products. Besides this, TPVs can also be reground and recycled for several times.

Literatures about the use of natural rubber based TPVs for the preparation of conductive materials are very limited to the best of our knowledge. Gomes de Souza Jr. et al [Polymer Testing, Volume 26, 2007] prepared a TPV material which was based on ethylene-vinyl acetate copolymer and nitrile rubber (a type of synthetic rubber), with PAni.DBSA. However, the TPV produced was only semi-electrically conductive with a volume electrical resistivity≥108 ohm-cm and targeted for the application as pressure sensitive devices. Meanwhile, U.S. Patents 2006/0004126 A1, U.S. Pat. No. 7,462,309 B2, 6,624,251 B1 all teach about the preparation of synthetic rubber based TPV materials.

In view of the foregoing, there is a need to provide an improved manufacturing process for manufacturing Hevea *Brasiliensis* natural rubber based TPV materials which exhibit high electrical conductivities, good tensile properties and high electromagnetic interferences [EMI] shielding effectiveness. Further, it is also a requirement that the manufactured Hevea *Brasiliensis* natural rubber based TPV materials are highly processable (via injection moulding or extrusion techniques) and also recyclable without significant loss of their good electrical conductivities, tensile properties and EMI shielding effectiveness.

The above mentioned shortcomings, disadvantages and problems are addressed herein and which will be understood by reading and studying the following specification.

SUMMARY OF INVENTION

The primary objective of the embodiments herein is to provide an electrically conductive peroxide-vulcanised thermoplastic vulcanisate which comprises of additives that exhibit electrical conductivity, tensile properties with good tensile strengths and provide good electromagnetic interference (EMI) shielding.

Another objective of the embodiments herein is to provide an electrically conductive peroxide-vulcanised thermoplastic vulcanisate which can be reprocess without significant loss of EMI shielding effectiveness, electrical and tensile properties.

The embodiments herein disclose a method and device for manufacturing electrically conductive peroxide-vulcanised thermoplastic vulcanisate, the method comprising of preparing a thermoplastic vulcanisate, composition comprising of at least 40.0% to 60.0% weight of solid Hevea *Brasiliensis* natural rubber of any solid grade and adding at least 40.0% to 60.0% weight of solid polypropylene of any solid grade to the thermoplastic vulcanisate which is under preparation. Further, at least 1.0% to 50.0% weight of solid sulfonic acid doped polyaniline with protonation level at at least 40%-100% with 1.5±0.5 p.p.h.r. of dicumyl peroxide purity of at least 95%-100% weight are added to the thermoplastic vulcanisate which is under preparation. Also, 2.0±1.0 p.p.h.r. of peroxide vulcanisation system's accelerator with the purity of at least 95%-100% weight and 7.0±1.0 p.p.h.r. peroxide vulcanisation agent with the purity of at least 95%-100% weight and 0.5%-2.0% weight of a compatibiliser with the purity of at least 95%-100% weight is added to the thermoplastic vulcanisate composition as additives which is under preparation.

These mixed compositions with the additives are fed to device that comprises of at least a pair of controllable moving ram capable of performing up and down movements, a pair of rotating rotors whose rotating speed is controllable paired with a heating component and coupled to the rotating rotors in order to control the thermoplastic vulcanisate mixing chamber's temperature and further the prepared thermoplastic vulcanisate composition is made to pass in to the thermoplastic vulcanisate mixing chamber which comprises of at least a pair of electrically charged rotating rotors which results in obtaining an electrically conductive peroxide-vulcanised thermoplastic vulcanisate.

According to the embodiment herein, preparation of electrically conductive TPVs and TPVs based on Hevea *Brasiliensis* natural rubber [NR] and polypropylene [PP] with different loadings of PAni.DBSA in the presence of compatibiliser or compsotions. These TPVs are prepared by using an internal mixing device at controlled mixing conditions. The polypropylene is considered the best choice for blending with natural rubber due to its high softening temperature of about 150° C. and low glass transition temperature of about −60° C. for the blend, giving rise to a very versatile thermoplastic applicable over a wide range of temperatures. PAni.DBSA was chosen here due to its low toxicity, good thermal stability, high electrical conductivities, good compatibility with natural rubber or polypropylene and well-established synthesis method.

According to the embodiment herein, the present invention provides an electrically conductive peroxide-vulcanised thermoplastic vulcanisate wherein the additives or composition used in preparing the thermoplastic vulcanisate exhibit electrical conductivities of at least up to 2.1±0.2 S/cm, tensile properties with tensile strengths at least up to 14.0 MPa and EMI shielding effectiveness of at least up to 30 dB.

According to the embodiment herein, the present invention provides an electrically conductive peroxide-vulcanised thermoplastic vulcanisate wherein the prepared electrically conductive peroxide-vulcanised thermoplastic vulcanisate be reprocessed at least up to 4 cycles without significant loss of at least up to 10.0% of their EMI shielding effectiveness, electrical and tensile properties.

According to the embodiment herein, the present invention provides an electrically conductive peroxide-vulcanised thermoplastic vulcanisate wherein the prepared electrically conductive peroxide-vulcanised thermoplastic vulcanisate be used for manufacturing of electromagnetic interferences shielding products, such as but not limited to seals and gaskets.

According to the embodiment herein, the present invention provides an electrically conductive peroxide-vulcanised thermoplastic vulcanisate wherein the preparation of electrically conductive peroxide-vulcanised thermoplastic vulcanisate includes but not limited to high temperature-mechanical mixing by using an internal mixing device at a temperature of at least 100 to 230° C. and the fill factor of at least 0.60 to 0.90 and rotors speed of at least 50-120 rounds per minute.

According to the embodiment herein, the present invention provides a device to prepare the thermoplastic vulcanisate wherein the size and capacity of the device to prepare thermoplastic vulcanisate is variable depending on the quantity of the material that is to be processed.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the scope thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
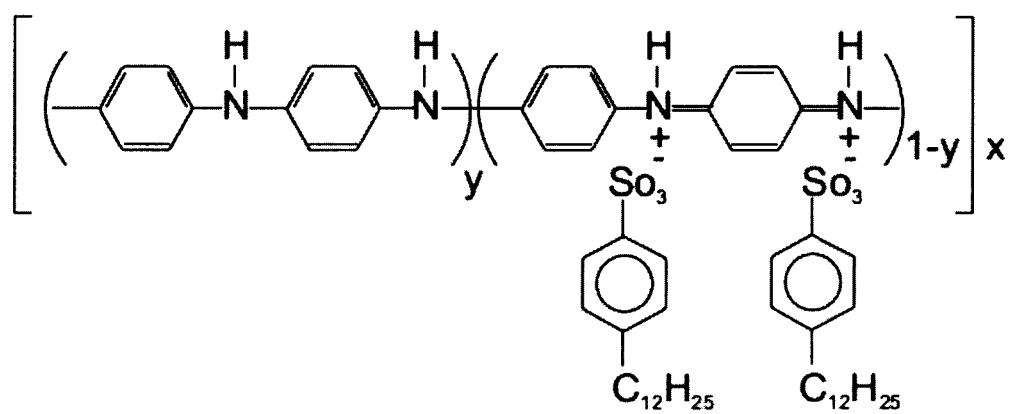
FIG. 1 illustrates the basic chemical structure of the smallest repeat unit of a sulfonic acid doped polyaniline example, i.e. the polyaniline dodecylbenzenesulfonate, according to an embodiment herein.

Although specific features of the present invention are shown in some drawings and not in others. This is done for convenience only as each feature may be combined with any or all of the other features in accordance with the present invention.

DETAILED DESCRIPTION OF THE EMBODIMENTS

The present invention provides a method and device for manufacturing Hevea *Brasiliensis* natural rubber based electrically conductive thermoplastic vulcanisates [TPVs]. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The present invention describes a practical and environmentally friendly method (i.e. the high temperature-mechanical mixing) describing the method of preparing the Hevea *Brasiliensis* natural rubber based electrically conductive thermoplastic vulcanisate. The peroxide-vulcanised electrically conductive thermoplastic vulcanisates in present embodiment are based on the solid Hevea *Brasiliensis* natural rubber as the rubber matrix, solid polypropylene as the thermoplastic matrix and solid sulfonic acid doped polyaniline as the only electrically conductive filler. These three major components are known to be highly processable with the help of introduction of a compatibiliser, in particular hydroquinone. All peroxide-vulcanised electrically conductive TPV materials in this present invention are also capable of being formed using injection-moulded or extruded in order to produce different shapes of final product.

In view of the great difficulty of direct dispersing of solid sulfonic acid doped polyaniline within the TPV host matrix, it is now able to demonstrate that the very high conductivities of the peroxide-vulcanised Hevea *Brasiliensis* natural rubber based thermoplastic vulcanisate (reaching at the order of 2.1±0.2 S/cm) can be produced by using the high temperature-mechanical method (i.e. with an internal mixing device), which is a practical and highly efficient method. A compatibiliser is also introduced to the TPV material in order to enhance the processability and dispersion level of the solid sulfonic acid doped polyaniline within both Hevea *Brasiliensis* natural rubber and polypropylene host matrixes.

This kind of peroxide-vulcanised electrically conductive TPV is also obtained from a carbon blacks-free formulation. In other words, it can help to promote a cleaner and healthier (non-black) production/working environment. Potential commercial application, i.e. for the electromagnetic interferences [EMI] shielding products (such as seals and gaskets) can also be manufactured using this kind of TPV material. Suitable methods for processing this type of TPV materials are various types of rubber processing equipment, such as injection moulding machine and extruder.

TPV blends with 40.0 to 60.0 weight % of solid Hevea *Brasiliensis* natural rubber and 40.0 to 60.0 weight % of solid polypropylene [PP] are first prepared by using a temperature controllable internal mixing device (at temperature 100-230° C., fill factor 0.60 to 0.90 and rotors speed at 50-120 rounds per minute). A mixture of peroxide vulcanisation system, which including 1.5±0.5 p.p.h.r. dicumyl peroxide, 2.0±1.0 p.p.h.r. peroxide vulcanisation system's accelerator and 7.0±1.0 p.p.h.r. peroxide vulcanisation agent are also added to the TPV material at this first stage of mixing.

Further, a 1.0 to 50.0 weight % of solid sulfonic acid doped polyaniline electrically conductive filler with protonation level of 40-100% and 0.5-2.0 weight % of a compatibiliser are added to the TPV material at the second stage of mixing also by using a temperature controllable internal mixing device (at temperature 100-230° C., fill factor 0.60 to 0.90 and rotors speed at 50-120 rounds per minute).

All peroxide-vulcanised electrically conductive TPVs [including 1.0 to 50.0 weight % of solid sulfonic acid doped polyaniline electrically conductive fillers] prepared by using the high temperature-mechanical mixing exhibit good electrical conductivities (up to 2.1±0.2 S/cm), good tensile properties (with tensile strengths up to 14.0 MPa) and good EMI shielding effectiveness (up to 30 dB). These peroxide-vulcanised electrically conductive TPVs can also be reprocessed up to 4 cycles without significant loss of their EMI shielding effectiveness, electrical and tensile properties (tensile properties show slight decrement up to 10.0%).

Mixing proportions and function of each of the main chemicals, raw materials and processing equipment that are used to produce the peroxide-vulcanised electrically conductive TPV are listed as following:

A 1.0 to 50.0 weight % of solid sulfonic acid doped polyaniline with protonation level at 40-100% (FIG. 1 for its molecular structure) are used as the only electrically conductive fillers. A 40.0 to 60.0 weight % of solid Hevea Brasiliensis natural rubber (any solid grades) are used as the solid rubber host with 40.0 to 60.0 weight % of solid polypropylene [PP] (any solid grades) which are used as the solid thermoplastic host.

1.5±0.5 p.p.h.r. of dicumyl peroxide, 2.0±1.0 p.p.h.r. of peroxide vulcanisation system's accelerator and 7.0±1.0 p.p.h.r. peroxide vulcanisation agent (all with purity, 95-100 wt %) are used as the ingredients of the peroxide system vulcanisation purpose for all peroxide-vulcanised electrically conductive TPVs. Further, a 0.5-2.0 weight % of a compatibiliser (purity 95-100 wt %) is included into all TPVs in order to enhance the processability and dispersion level of the solid sulfonic acid doped polyaniline.

An internal mixing device is a general rubber or polymer processing device, which includes of some main structures in a closed system, i.e. a controllable moving (up and down movements) ram, a pair of rotating rotors (with controllable rotating speed) and equipped with a heating system in order to control the mixing chamber's temperature. Size of the device is varied and depends on the amount of material that is processed.

FIG. 1 illustrates the basic chemical structure of the smallest repeat unit of a sulfonic acid doped polyaniline example, i.e. the polyaniline dodecylbenzenesulfonate, according to an embodiment herein. According to the embodiment herein, a 1.0 to 50.0 weight % of solid sulfonic acid doped polyaniline with protonation level at 40-100% are used as the only electrically conductive fillers with a 40.0 to 60.0 weight % of solid Hevea Brasiliensis natural rubber (any solid grades) as the solid rubber host with 40.0 to 60.0 weight % of solid polypropylene [PP] (any solid grades) as the solid thermoplastic host additives in obtaining an electrically conductive peroxide-vulcanised thermoplastic vulcanisate.

Figure 2:
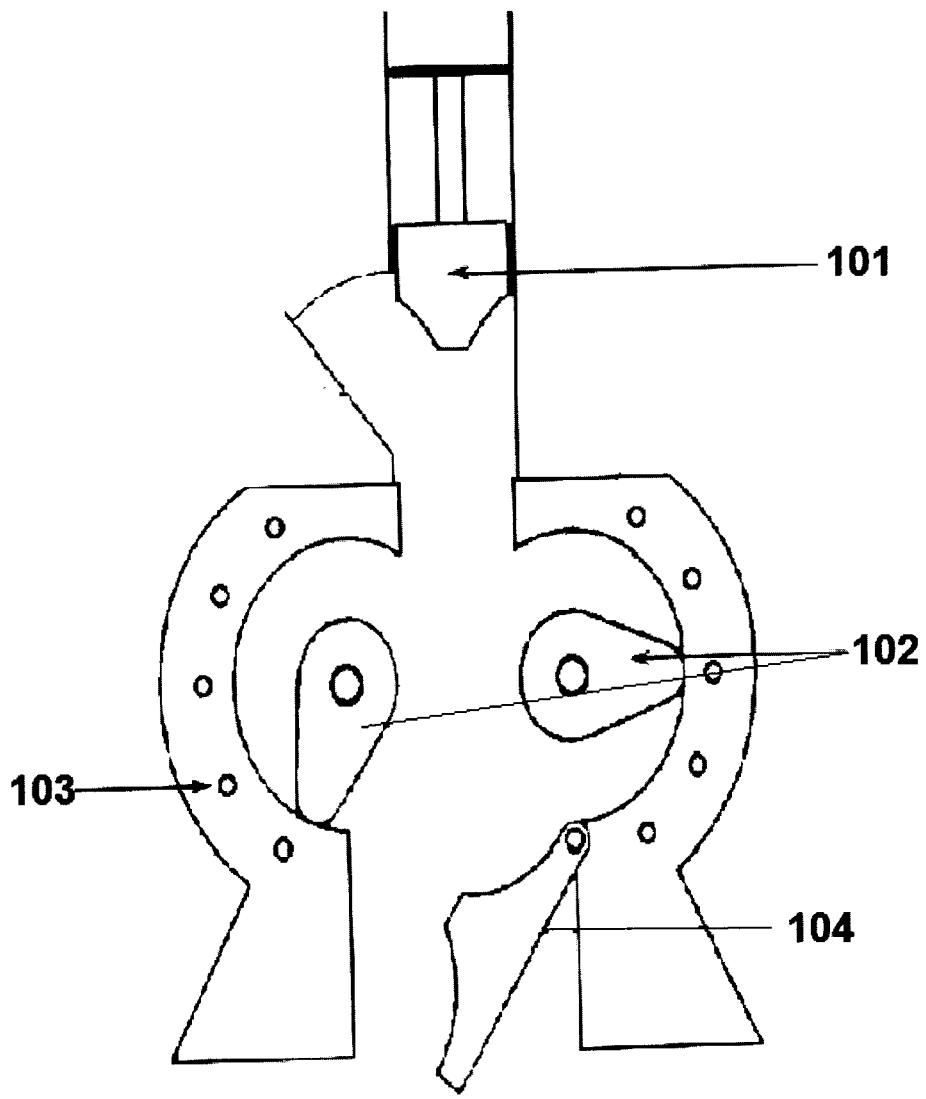
FIG. 2 illustrates the general 2-dimensional anatomical view of the main structures for an internal mixing device, according to an embodiment herein.

FIG. 2 illustrates the general 2-dimensional anatomical view of the main structures for an internal mixing device, according to an embodiment herein. According to the embodiment herein, the internal mixing device is a general rubber or polymer processing device, which includes of some main structures in a closed system, i.e. a controllable moving (up and down movements) ram 101, a pair of rotating rotors 102 (with controllable rotating speed) and equipped with a heating system 103 in order to control the mixing chamber's temperature. Size of the device is varied and depends on the amount of material that is processed. All final products are collected through the discharge door 104.

The pre-mixed electrically conductive peroxide-vulcanised thermoplastic vulcanisate composition is fed into the device that comprises of at least a pair of controllable moving ram 101 capable of performing up and down movements, a pair of rotating rotors 102 whose rotating speed is controllable paired with a heating component 103 and coupled to the rotating rotors 102 in order to control the thermoplastic vulcanisate mixing chamber's temperature. The prepared thermoplastic vulcanisate composition is made to pass in to the thermoplastic vulcanisate mixing chamber which comprises of at least a pair of electrically charged rotating rotors 102 and 103. The electrically charged rotating rotors 102 and 103 binds the additives present in the composition into a layer of a TPV and the final product are collected which results in obtaining an electrically conductive peroxide-vulcanised thermoplastic vulcanisate.

Figure 3:
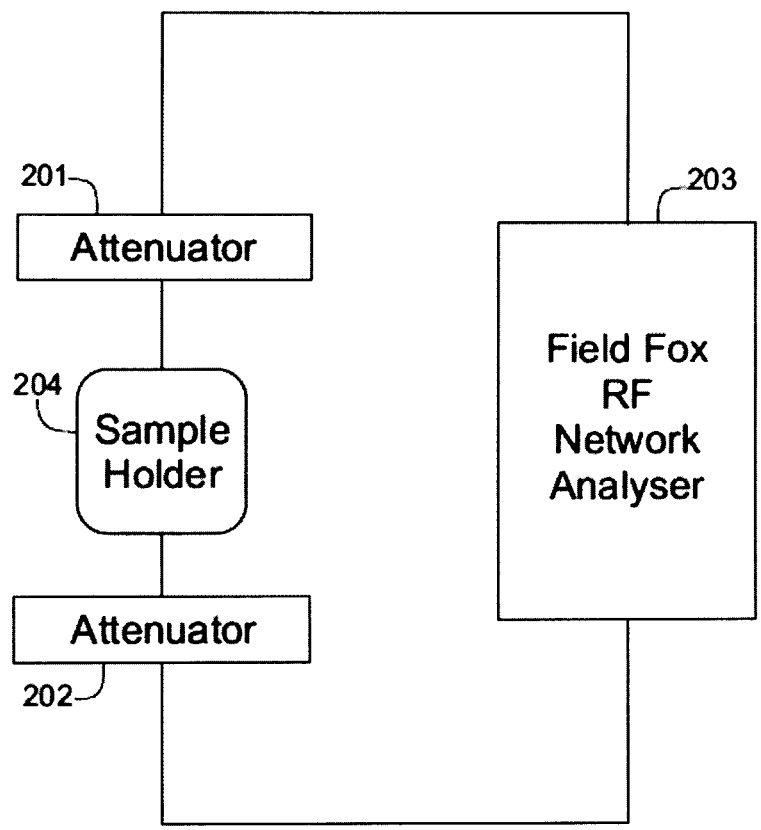
FIG. 3 illustrates the general setup of an electromagnetic interferences shielding effectiveness test system, according to an embodiment herein.

FIG. 3 illustrates the general setup of an electromagnetic interferences shielding effectiveness test system, according to an embodiment herein. According to the embodiment herein, the EMI shielding effectiveness of all peroxide-vulcanised TPV samples was determined by using a FieldFox 10 GHz RF Vector Network Analyser 203. The purpose of this test is to determine the insertion loss [IL] due to introducing a material between the source and signal analyser. The EMI shielding effectiveness is determined by measuring the electric field strength levels with both reference [ER] and load [EL] samples placed in the sample holder 204 and dBR and dBL are the transmission readings collected from the attenuators 201 and 202 for reference sample and load sample respectively.

Figure 4:
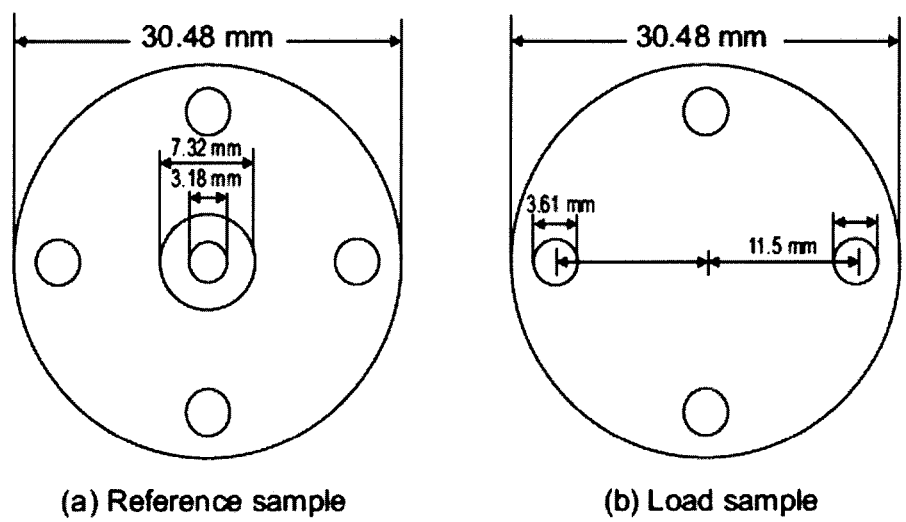
FIG. 4 illustrates dimensions of an electromagnetic interferences shielding effectiveness test sample with thickness 2.0±0.5 mm, according to an exemplary embodiment herein.

FIG. 4 illustrates dimensions of an electromagnetic interferences shielding effectiveness test sample with thickness 2.0±0.5 mm, according to an exemplary embodiment herein. According to the embodiment herein, the dimensions of the EMI shielding effectiveness are analysed from the reference sample and the load sample. The frequency range used for this experiment was 0-10 GHz and the EMI shielding effectiveness for all peroxide-vulvanised TPVs (without or with addition of PAni.DBSA) was recorded. The electromagnetic interferences (EMI) shielding effectiveness of a sample has strong dependence on both its thickness and electrical conductivity. However, the thickness of all samples tested here were fixed at 2.0 mm and hence, it is expected those samples with higher electrical conductivities shall have a better EMI shielding effectiveness. The raw TPV and TPV with only 1.0 wt % of PAni.DBSA content are almost transparent to the electromagnetic interference. The EMI SE of all peroxide-vulcanised TPVs was enhanced with the PAni.DBSA content which was due to the increment of their electrical conductivities. A reasonable good EMI SE, i.e. 24-30 dB was recorded for TPVs with ≥30.0 wt % of PAni.DBSA content.

Following are certain examples and experiments that were recorded during and after the preparation of peroxide-vulcanised electrically conductive TPVs Example: 1-Preparation of Peroxide-Vulcanised TPVs The 60.0:40.0 wt % of Hevea Brasiliensis natural rubber-polypropylene TPVs were prepared by using the Haake Rheomix 600 Internal Mixer. A fill factor of 0.80 was used for all mixings. The starting temperature for each mixing was 135° C., rotor speed was 80 r.p.m. and the total duration was 9 mins. A mixture of dicumyl peroxide, dibenzothiazol-2-yl disulphide [MBTS, as the accelerator) and m-phenylene bismaleimide [HVA-2, as the vulcanisation agent] in a proportion of 1.5:2.0:7.5 p.p.h.r. was used as the peroxide vulcanisation system. Stages of the mixing of this NR-PP based TPV are summarised in Table 1.

TABLE 1

Stages of mixing for Hevea Brasiliensis Natural Rubber [NR]-Polypropylene [PP] TPV by using an internal mixer (Haake Rheomix 600)

| Stage of mixing | Timing |
|---|---|
| 1. Addition of PP | 0th minute |
| 2. Addition of NR | 1st minute |
| 4. Addition of dicumyl peroxide, MBTS and HVA-2 | 4th minute |
| 5. Dumping | 9th minute |
| | (Total time = 9 mins) |

The TPV-solid sulfonic acid doped polyaniline mixtures were also prepared by using the same internal mixer with the same mixing conditions. The proportions of added solid sulfonic acid doped polyaniline [PAni.DBSA] were 1.0, 2.5, 5.0, 7.5, 10.0, 20.0, 30.0, 40.0 and 50.0 wt % respectively. The hydroquinone of 1.0 wt % was also added to each TPV-solid sulfonic acid doped polyaniline blend as the compatibiliser. The total mixing duration of each TPV-solid sulfonic acid doped polyaniline blend was 4.0 mins. The resulted TPV-solid sulfonic acid doped polyaniline blends were injection-moulded (via Toshiba 1580EPN-2A) under pressure of 0.96 KPa at 170° C.

Example: 2-Electrical and Tensile Properties of Peroxide-Vulcanised TPVs

Peroxide-vulcanised TPVs prepared by using the high temperature-mechanical mixing (as described in Example 1) have the orders of electrical conductivity (measured using the guarded 2-probes method) as summarised in Table 2, which rendered the material suitable for the EMI shielding application.

TABLE 2

Orders of Electrical Conductivity (in the unit of S/cm) for Peroxide-Vulcanised TPVs

| PAni.DBSA content (weight %) | Electrical Conductivity Order (S/cm) |
|---|---|
| 0.0 | $\times 10^{-13}$ |
| 2.5 | $\times 10^{-7}$ |
| 5.0 | $\times 10^{-3}$ |
| 10.0 | $\times 10^{-2}$ |
| 20.0 | $\times 10^{-1}$ |
| 30.0 | $\times 10^{-1}$ |
| 40.0 | $\times 10^{0}$ |
| 50.0 | $\times 10^{0}$ |

Peroxide-vulcanised TPVs prepared by using the high temperature-mechanical mixing (as described in Example 1) also have some main non-aged tensile properties (measured according to the standard, i.e. BS ISO 37-2005) as shown in Table 3.

TABLE 3

Non-Aged Tensile Properties of Peroxide-Vulcanised TPVs

| PAni.DBSA content (weight %) | Tensile Strength (MPa) | Elongation (at Break %) |
|---|---|---|
| 0.0 | 8.3 ± 0.5 | 246.0 ± 30.0 |
| 5.0 | 10.0 ± 0.5 | 269.0 ± 30.0 |
| 10.0 | 11.4 ± 0.5 | 281.0 ± 30.0 |
| 20.0 | 12.8 ± 0.5 | 297.0 ± 30.0 |
| 30.0 | 14.0 ± 0.5 | 307.0 ± 30.0 |
| 40.0 | 12.2 ± 0.5 | 286.0 ± 30.0 |
| 50.0 | 10.9 ± 0.5 | 273.0 ± 30.0 |

Example: 3-EMI Shielding Effectiveness of Peroxide-Vulcanised TPVs

The EMI shielding effectiveness of all peroxide-vulcanised TPV samples was determined by using a FieldFox 10 GHz RF Vector Network Analyser. The purpose of this test is to determine the insertion loss [IL] due to introducing a material between the source and signal analyser. The EMI SE is determined by measuring the electric field strength levels with both reference [ER] and load [EL] samples (refer to Equation 1):

$$SE = 20\log_{10}\left(\frac{E_R}{E_L}\right) = (dB_R) \cdot (dB_L) \tag{1}$$

dBR and dBL are the transmission readings from the attenuators for reference sample and load sample respectively. FIG. 3 shows the general setup for the EMI shielding effectiveness testing system and meanwhile, FIG. 4 shows the dimensions of the EMI shielding effectiveness test samples. The frequency range used for this experiment was 0-10 GHz. EMI shielding effectiveness for all peroxide-vulcanised TPVs (without or with addition of PAni.DBSA) was determined and their results are summarised in Table 4.

TABLE 4

EMI shielding effectiveness [EMI SE] for Peroxide-Vulcanised TPVs

| PAni.DBSA content (weight %) | EMI SE (dB) |
|---|---|
| 0.0 | 0 |
| 1.0 | 0 |
| 2.5 | 3 |
| 5.0 | 8 |
| 10.0 | 12 |
| 20.0 | 17 |
| 30.0 | 24 |
| 40.0 | 26 |
| 50.0 | 30 |

The EMI shielding effectiveness of a sample has strong dependence on both its thickness and electrical conductivity. However, the thickness of all samples tested here were fixed at 2.0 mm and hence, it is expected those samples with higher electrical conductivities shall have a better EMI shielding effectiveness. The raw TPV and TPV with only 1.0 wt % of PAni.DBSA content are almost transparent to the electromagnetic interference. The EMI SE of all peroxide-vulcanised TPVs was enhanced with the PAni.DBSA content which was due to the increment of their electrical conductivities. A reasonable good EMI SE, i.e. 24-30 dB was recorded for TPVs with ≥30.0 wt % of PAni.DBSA content.

Example 4: Recyclability of Peroxide-Vulcanised TPVs

Recyclability in terms of basic tensile properties, electrical conductivities and EMI SE of all peroxide-vulcanised TPV samples was assessed. Each peroxide-vulcanised TPV sample was stripped and reground by using a granulator (Plascare PH-500SS). Granulates of these recycled samples were re-moulded by using the same injection moulding machine with the same conditions as for the virgin samples. All these processes were repeated up to four times for each sample.

All peroxide-vulcanised TPVs were reprocessed and examples of the obtained results for TPVs with 30.0 wt % and 50.0 wt % of PAni.DBSA contents are summarised in Table 5. All peroxide-vulcanised TPVs could be reprocessed without major difficulty. The reprocessing does not seem to affect the electrical properties and EMI shielding effectiveness of all these TPVs. Their electrical conductivities and EMI shielding effectiveness values remained almost constant throughout the four cycles of reprocessing. However, their physical properties were slightly impaired (up to about 10% at the 4th cycle of reprocessing), regardless of their PAni.DBSA contents, as can be observed from the declines of tensile strength, EB % and hardness with increasing recycling.

TABLE 5

Physical, electrical properties and EMI shielding effectiveness [EMI SE] of the virgin and recycled peroxide-vulcanised TPVs with 30.0 wt % and 50.0 wt % PAni.DBSA content

| Property | 0th (Virgin) | $1^{st}$ | $2^{nd}$ | $3^{rd}$ | $4^{th}$ |
|---|---|---|---|---|---|
| Peroxide-Vulcanised TPV with 30.0 wt % PAni.DBSA | | | | | |
| Tensile strength (MPa) | 14.0 ± 0.5 | 13.8 ± 0.5 | 13.5 ± 0.5 | 13.3 ± 0.5 | 12.9 ± 0.5 |
| EB % | 307 ± 5 | 299 ± 5 | 292 ± 5 | 285 ± 5 | 277 ± 5 |
| Hardness (IRHD) | 65 ± 1 | 64 ± 1 | 63 ± 1 | 61 ± 1 | 60 ± 1 |
| Electrical conductivity (S/cm) | $2.5 \times 10^{-1}$ | $2.5 \times 10^{-1}$ | $2.5 \times 10^{-1}$ | $2.5 \times 10^{-1}$ | $2.4 \times 10^{-1}$ |
| EMI SE (dB) | 24 | 24 | 24 | 24 | 24 |
| Peroxide-Vulcanised TPV with 50.0 wt % PAni.DBSA | | | | | |
| Tensile strength (MPa) | 10.9 ± 0.5 | 10.6 ± 0.5 | 10.4 ± 0.5 | 10.3 ± 0.5 | 10.1 ± 0.5 |
| EB % | 273 ± 5 | 268 ± 5 | 260 ± 5 | 254 ± 5 | 249 ± 5 |
| Hardness (IRHD) | 72 ± 1 | 71 ± 1 | 69 ± 1 | 67 ± 1 | 65 ± 1 |
| Electrical conductivity (S/cm) | 2.1 | 2.1 | 2.1 | 2.1 | 2.1 |
| EMI SE (dB) | 30 | 30 | 30 | 30 | 30 |

Although the embodiments herein are described with various specific embodiments, it will be obvious for a person skilled in the art to practice the invention with modifications. However, all such modifications are deemed to be within the scope of the claims.

Example 5: Natural Rubber Based Electrically Conductive TPVs

Three types of TPV based on Hevea *Brasiliensis* Natural Rubber [NR], poly(butadiene-co-acrylonitrile) [NBR] and ethylene-propylene-diene rubber [EPDM] were prepared respectively according to the method as described in the patent draft. Both NBR and EPDM are common kinds of synthetic rubber used to prepare a TPV. However, only TPV based on NR was added with a compatibiliser, i.e. hydroquinone (at 1.0 wt % content) in order to assess its effect on the resulted TPV's properties. Apart from this, amount for the conductive filler (PAni.DBSA) loading for all these TPVs was fixed at 30.0 wt %.

Three kinds of test were performed for all these prepared TPVs, i.e.:
(1) Electrical conductivity, determined using the guarded 2-probes method;
(2) Tensile properties, i.e. non-aged tensile strength and elongation at break [EB] %, conducted according to BS ISO 37-2005 procedures;
(3) EMI shielding effectiveness, determined by using a FieldFox 10 GHz RF Vector Network Analyser.

Results for all these tests are summarised in below Table 6.

TABLE 6

Electrical Conductivities, Tensile Properties (Non-Aged) and EMI Shielding Effectiveness for Natural and Synthetic Rubbers based TPV

| | NBR based TPV | EPDM based TPV | NR based TPV |
|---|---|---|---|
| 1. Electrical conductivities (S/cm) | $1.7 \times 10^{-2}$ | $2.3 \times 10^{-2}$ | $2.5 \times 10^{-1}$ |
| 2. Tensile strength (MPa) | 12.2 ± 0.5 | 11.5 ± 0.5 | 14.0 ± 0.5 |
| 3. EB % | 234.0 ± 30.0 | 215.0 ± 30.0 | 307.0 ± 30.0 |
| 4 EMI shielding effectiveness (dB) | 17 | 17 | 24 |

NR based TPV is more electrically conductive (about a magnitude order higher) than both synthetic rubber based TPVs. Besides this, NR based TPV shows significant better non-aged tensile properties than those synthetic rubber based TPVs. The EMI shielding effectiveness for NR based TPV is also about 41% higher than those synthetic rubber based ones. All these phenomena are attributed to a better compatibility and homogeneity for the NR based TPV. This also makes the NR based TPV a more ideal raw material for the related industrial application.

Example 6: Natural Rubber Based Electrically Conductive Thermoplastic Vulcanisates Two types of Hevea *Brasiliensis* Natural Rubber [NR] based TPV were prepared respectively according to the method as described in this patent application. First TPV is based on carbon black filler (grade N220) and second TPV is based on sulfonic acid doped polyaniline [PAni.DBSA] as the filler.

Two different types of test were performed for all these TPVs, i.e.:
1. Electrical conductivity, determined using the guarded 2-probes method;
2. EMI shielding effectiveness, determined by using a FieldFox 10 GHz RF Vector Network Analyser Results for all these tests are summarised in Tables 7 and 8 respectively.

TABLE 7

Electrical Conductivities and EMI Shielding Effectiveness for TPV based on Carbon Black (N220)

| Filler content (wt %) | Electrical conductivities (S/cm) | EMI shielding effectiveness (dB) |
|---|---|---|
| 5.0 | $2.5 \times 10^{-10}$ | 1 |
| 10.0 | $7.3 \times 10^{-9}$ | 3 |
| 20.0 | $6.4 \times 10^{-8}$ | 5 |
| 30.0 | $1.9 \times 10^{-6}$ | 6 |
| 40.0 | $7.1 \times 10^{-3}$ | 8 |

TABLE 8

Electrical Conductivities and EMI Shielding Effectiveness for TPV based on Sulfonic Acid Doped Polyaniline

| Filler content (wt %) | Electrical conductivities (S/cm) | EMI shielding effectiveness (dB) |
|---|---|---|
| 5.0 | $9.2 \times 10^{-3}$ | 8 |
| 10.0 | $4.6 \times 10^{-2}$ | 12 |
| 20.0 | $5.8 \times 10^{-1}$ | 17 |
| 30.0 | 1.2 | 24 |
| 40.0 | 2.3 | 26 |

TPVs based on sulfonic acid doped polyaniline [PAni.DBSA] are far more electrically conductive (about 7 magnitude orders higher) than TPVs based on conventional grade carbon black. Besides this, at the same amount of filler content, TPVs based on PAni.DBSA also shows significant higher EMI shielding effectiveness than the carbon black based TPVs. All these phenomena are attributed to a better compatibility and homogeneity for the PAni.DBSA based TPV. Meanwhile, carbon black fillers tend to phase separate and agglomerate within the rubber host matrix.

The invention claimed is:

1. A method for manufacturing electrically conductive peroxide-vulcanised thermoplastic vulcanisate [TPV], the method comprising:
   (a) preparing a thermoplastic vulcanisate, composition comprising of at least 40.0% to 60.0% weight of solid Hevea *Brasiliensis* natural rubber of any solid grade;
   (b) adding at least 40.0% to 60.0% weight of solid polypropylene of any solid grade to the thermoplastic vulcanisate which is in preparation;
   (c) adding at least 1.0% to 50.0% weight of solid sulfonic acid doped polyaniline with protonation level at at least 40%-100% to the thermoplastic vulcanisate which is in preparation;
   (d) adding 1.5±0.5 p.p.h.r. of dicumyl peroxide purity of at least 95%-100% weight to the thermoplastic vulcanisate which is in preparation;
   (e) adding 2.0±1.0 p.p.h.r. of peroxide vulcanisation system's accelerator with the purity of at least 95%-100% weight to the thermoplastic vulcanisate which is in preparation;
   (f) adding 7.0±1.0 p.p.h.r. peroxide vulcanisation agent with the purity of at least 95%-100% weight to the thermoplastic vulcanisate which is in preparation; and
   (g) adding 0.5%-2.0% weight of a compatibiliser with the purity of at least 95%-100% weight to the thermoplastic vulcanisate which is in preparation
   wherein, a device to prepare the thermoplastic vulcanisate comprises of at least a pair of controllable moving ram capable of performing up and down movements, a pair of rotating rotors whose rotating speed is controllable paired with a heating component and coupled to the rotating rotors in order to control the thermoplastic vulcanisate mixing chamber's temperature and further the prepared thermoplastic vulcanisate composition is made to pass in to the thermoplastic vulcanisate mixing chamber which comprises of at least a pair of electrically charged rotating rotors which results in obtaining an electrically conductive peroxide-vulcanised thermoplastic vulcanisate.

2. The method according to claim 1, wherein the additives or composition used in preparing the thermoplastic vulcanisate exhibit electrical conductivities of at least up to 2.1±0.2 S/cm, tensile properties with tensile strengths at least up to 14.0±0.5 MPa and EMI shielding effectiveness of at least upto 30 dB.

3. The method according to claim 1, wherein the prepared electrically conductive peroxide-vulcanised thermoplastic vulcanisate is reprocessed at least up to 4 cycles without significant loss of at least up to 10.0% of their EMI shielding effectiveness, electrical and tensile properties.

4. The method according to claim 1, wherein the prepared electrically conductive peroxide-vulcanised thermoplastic vulcanisate is used for manufacturing of electromagnetic interferences shielding products.

5. The method according to claim 1, wherein the preparation of electrically conductive peroxide-vulcanised thermoplastic vulcanisate includes high temperature-mechanical mixing by using an internal mixing device at a temperature of at least 100 to 230° C. and the fill factor of at least 0.60 to 0.90 and rotors speed of at least 50-120 rounds per minute.

6. The method according to claim 1, wherein size and capacity of the device to prepare the thermoplastic vulcanisate is variable depending on the quantity of the material that is to be processed.

* * * * *